United States Patent [19]

Dalal

[11] Patent Number: 4,642,727
[45] Date of Patent: Feb. 10, 1987

[54] ELECTROSTATIC DISCHARGE PROTECTION FOR ELECTRONIC EQUIPMENT

[75] Inventor: Samir K. Dalal, El Paso, Colo.

[73] Assignee: Honeywell Inc., Minneapolis, Minn.

[21] Appl. No.: 706,820

[22] Filed: Feb. 28, 1985

[51] Int. Cl.⁴ ............................................. H05F 3/02
[52] U.S. Cl. ...................................... 361/212; 361/220
[58] Field of Search ............................. 361/212, 220; 206/328–330, 332, 334

[56] References Cited

U.S. PATENT DOCUMENTS 4,439,809  3/1984  Weight et al. ...................... 361/220

Primary Examiner—L. T. Hix
Assistant Examiner—Douglas S. Lee
Attorney, Agent, or Firm—Charles L. Rubow

[57] ABSTRACT

A protection device for a housing containing sensitive electronic equipment to protect the equipment against radio frequency interference that may accompany a spark generated when a person touches the housing and discharges electrostatic charge. The device includes a pair of conducting plates separated by an insulator and electrically connected at only one end to ground potential mounted on the package at such a location that the person wishing access to the electronic equipment would normally first touch the package. Any RF energy generated by the spark in touching the outer plate will be absorbed by the inner plate so that the RF energy cannot damage the sensitive electronic equipment.

8 Claims, 1 Drawing Figure

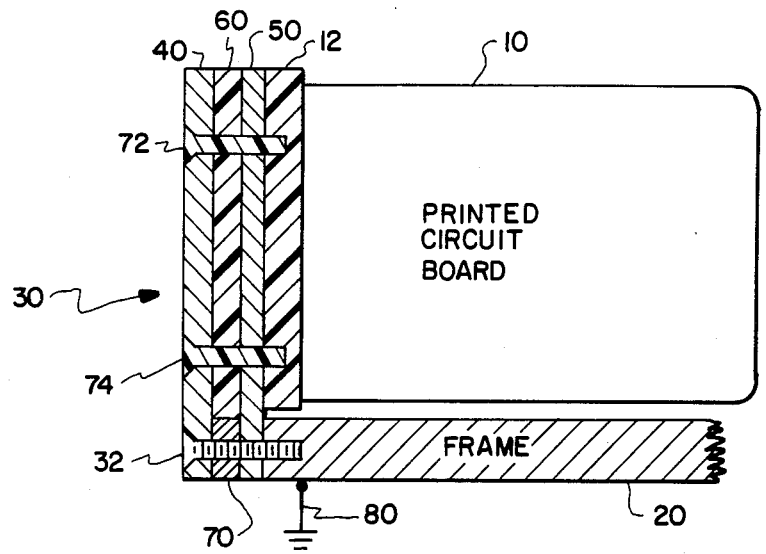

ELECTROSTATIC DISCHARGE PROTECTION FOR ELECTRONIC EQUIPMENT

BACKGROUND OF THE INVENTION

In the present state-of-the-art of packaging microcircuitry, printed circuits, and other sensitive electronic equipment, it is known that such circuitry needs to be protected against electrostatic discharges such as might occur when a person touches the equipment. Usual prior art precautions to prevent damage consist of grounding the frame or chassis particularly in the area of the access compartment of the housing so that any electrostatic build up in a person is transferred to ground before he can touch the sensitive equipment.

In some cases the grounding of the chassis or frame, either completely or at the area of the access port, is not sufficient to prevent certain kinds of problems. For example, when electronic circuitry includes parts that can respond to radio frequency signals such as the flip-flops and other components of microprocessors, then, when the person touches the outside of a grounded chassis, a spark may result which causes RF interference. This RF interference is believed to be projected from the inside surface of the grounded chassis and thus capable of effecting the electronic components. For example, the RF interference could then set flip-flops in a wrong state and thus cause "lock-up" of the microprocessor.

Accordingly, it is important not only to ground the electrostatic charge in a person, but also to prevent the possible sparks from causing problems.

SUMMARY OF THE INVENTION

The present invention utilizes a sandwich type structure which includes first and second electrically conductive plates separated along most of their length by suitable insulation and being electrically connected at only one end which end is also connected to a reference potential or ground. Then, if a spark occurs upon touching the outer of the two conductive plates, any RF interference eminating from the inside surface of the outer plate is absorbed by the inner of the two plates and grounded. With such an arrangement, both the discharge of the electrostatic build up in a person and the RF interference that could accompany a spark is prevented.

The sandwich structure is positioned with respect to the frame at or around the access port so that anyone attempting to open the housing and obtain access to the electronic equipment will normally have to touch the sandwich structure before he can gain such access. Of course, the entire chassis or frame of the housing can be made of the sandwiched material, but generally that portion near the access to the electronic equipment is all that is necessary.

BRIEF DESCRIPTION OF THE DRAWINGS

The sole FIGURE of the application is a cross-sectional view of a portion of a package of electronic equipment with the invention shown in cross-section.

DETAILED DESCRIPTION OF THE PREFERRED EMBODIMENT

In FIG. 1, a printed circuit board 10 is shown with an insulating member 12 along its left edge to hold the printed circuit board. The right side of board 10 may be mounted by common elements such as card guides (not shown) within a frame 20 which surrounds the printed circuit board 10 but is only shown in partial section in the FIGURE.

To gain access to the printed circuit board, the housing is provided with a sandwich or laminated assembly 30 which is mounted onto the frame 20 such as by a conductive screw 32.

Sandwich assembly 30 is comprised in the present invention by an outer conductive plate 40 and an inner conductive plate 50. Plates 40 and 50 are electrically conducting and extend from the frame 20 upwardly in the FIGURE to beyond a point where the printed circuit board 10 is mounted within the frame 20. Throughout most of the length between the conductive plates 40 and 50 an insulative member or spacer 60 is placed and is affixed to the plates 40 and 50 in any convenient way such as by glueing. The conductive plates may be of suitable conductive material such as copper and the insulative material 60 may be Mylar or other good insulator.

Along the lower edge between plates 40 and 50, a conductive spacer 70 having the same width as the insulative material 60 is mounted and arranged so that the screw 32 passes through both conductive plates, spacer, and is fastened into frame 20. The entire assembly, including the conductive plates 40 and 50, the insulator 60, and the conductive spacer 70, may be attached to the insulative member 12 and thus to the printed circuit board 10 by insulative screws 72 and 74. It is important to note that there is no electrical connection between plates 40 and 50 along the upper edge or the sides so that the area where the screw 32 joins the plates together is the only electrical path between the plates and the frame 20. Frame 20 is shown connected to a reference potential or ground such as by ground connection 80 in the FIGURE.

Only one printed circuit board has been shown in the FIGURE, but it should be realized that a number of circuit boards similar to the one shown will normally be mounted in the frame 20 usually parallel to, but spaced from the one shown. A sandwich structure like structure 30 will be attached to each printed circuit board with the space between the sandwich assemblies being kept to a minimum to prevent dust and dirt from entering the equipment. Then when a particular printed circuit board is to be removed, the conductive screw 32 associated therewith is unscrewed and a printed circuit card ejector (not shown) is operated to move the sandwich assembly and board a little to the left where it can be grasped by the operator. If the operator has not already touched the outside plate 40, he almost assuredly will when he grasps the sandwich assembly for removal and any spark will jump from the outside plate 40 at that time. As mentioned above, the sandwich structure is grounded only along the lower edge by the screw 32 connected to frame 20, conductive plates 40 and 50, and conductive spacer 70. There should be no other grounded locations on the sandwich structure. The reason for this is that if there were electrical connection between conductive plates 40 and 50 at other points around the periphery thereof, then the package consisting of plates 40, 50, and insulator 60 would operate as a single plate. As such, a spark which occurred at the outer plate 40 might act as if the sandwich structure were a single plate and RF interference could be emanated from the inside surface of inner plate 50 as has been suspected in the prior art. However, with the grounding connection only at one end thereof, while a spark occurring at the outer plate 40 in the present invention may cause RF interference to emanate from the inner surface of the outer plate 40, such interference will be absorbed by plate 50 and grounded and thus will not be able to affect the electronic equipment on the printed circuit board 10.

As mentioned above, the frame 20 would normally extend entirely around the printed circuit board 10 but the right side and upper portions of the frame have not been shown in the drawing for clarity. It may also be that other printed circuit stacks could occupy the space above printed circuit board 10. Furthermore, the location of the access port where the sandwich 30 is located is dictated by convenience in the design of the package and this may be either on the front, back, or possibly even lower or upper portions of the frame.

It is therefore seen that I have provided a protection apparatus to prevent RF energy which accompanies a sparking effect when a person discharges electrostatic energy to ground from damaging the sensitive electronic components within the package. Many alterations and modifications will occur to those skilled in the art and I do not intend to be limited to the specific disclosure shown in connection with the description of the preferred embodiment. I intend only to be limited by the following claims:

I claim:

1. Apparatus for use with a housing containing sensitive electronic equipment to protect the equipment against damage from radio frequency interference which may be generated when a discharge of electrostatic energy occurs from a person touching the apparatus comprising:
   a sandwich structure including a pair of conductive plates with an insulator therebetween and means electrically connecting said plates at only one end;
   means adapted to mount the sandwich structure on the housing between the equipment and the person so that the person will normally touch the sandwich structure first; and
   means connecting the one end of the sandwich structure to a source of reference potential.

2. Apparatus according to claim 1 wherein the equipment includes a printed circuit board and the sandwich structure is insulatively connected to the printed circuit board so that the board and the structure may be removed from the housing together.

3. Apparatus for use with a housing containing sensitive electronic equipment to protect the equipment against damage from radio frequency interference produced by a spark occurring when a person with an electrostatic charge touches the apparatus comprising:
   a sandwich structure including first and second conductive plates with an insulator therebetween and means electrically connecting the first and second plates at one end only thereof;
   means adapted to mount the sandwich structure on the housing in a position which a person would normally first touch when trying to access the equipment; and
   means grounding the sandwich structure at the one end so that any radio frequency interference from a spark produced by a person touching the structure will not adversely affect the equipment.

4. Apparatus according to claim 3 wherein the equipment includes a printed circuit board and the sandwich structure is insulatively connected to the printed circuit board so that both the board and the structure may be removed from the housing together.

5. Apparatus for use at an access port of a housing containing electronic equipment that might be damaged by radio frequency interference generated by a spark produced when a person having an electrostatic charge touches the apparatus, comprising:
   a first conducting plate;
   a second conducting plate;
   insulator means positioned between the first and second conducting plates;
   conductive means joining the first and second conducting plates at only one end; and
   means adapted to mount the first and second plates and the insulator to the housing to cover the access port and electrically connect the first and second conducting plates to ground potential at the one end.

6. Apparatus according to claim 5 wherein the conductive means includes a conductive screw through the first and second conductive plates and into the housing.

7. Apparatus according to claim 6 wherein the electronic equipment comprises a printed circuit board and further including means insulatively connecting the first and second conductive plates and the insulator means to the printed circuit board.

8. Apparatus according to claim 7 wherein the means insulatively connecting the first and second conductive plates and the insulator means to the printed circuit board comprises an insulative screw.

* * * * *